United States Patent
Adusumilli et al.

(10) Patent No.: US 10,170,419 B2
(45) Date of Patent: Jan. 1, 2019

(54) BICONVEX LOW RESISTANCE METAL WIRE

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/189,720

(22) Filed: Jun. 22, 2016

(65) Prior Publication Data
US 2017/0373006 A1 Dec. 28, 2017

(51) Int. Cl.
*H01L 23/48* (2006.01)
*H01L 23/52* (2006.01)
*H01L 23/528* (2006.01)
*H01L 23/532* (2006.01)
*H01L 21/768* (2006.01)

(52) U.S. Cl.
CPC .... *H01L 23/5283* (2013.01); *H01L 21/76816* (2013.01); *H01L 21/76831* (2013.01); *H01L 21/76832* (2013.01); *H01L 21/76883* (2013.01); *H01L 23/5329* (2013.01); *H01L 23/53219* (2013.01); *H01L 23/53223* (2013.01); *H01L 23/53233* (2013.01); *H01L 23/53238* (2013.01); *H01L 23/53266* (2013.01)

(58) Field of Classification Search
CPC ......... H01L 21/76816; H01L 21/76831; H01L 21/76832; H01L 21/76883; H01L 23/53223; H01L 23/53238; H01L 23/53266; H01L 23/5329; H01L 21/76841; H01L 28/75; H01L 29/4933; H01L 29/4941; H01L 33/0377; H01L 41/0815
USPC ......................................................... 257/751
See application file for complete search history.

(56) References Cited

U.S. PATENT DOCUMENTS

| | | |
|---|---|---|
| 5,965,934 A | 10/1999 | Cheung et al. |
| 6,815,342 B1 | 11/2004 | Cheng et al. |
| 6,940,108 B2 | 9/2005 | Cheng et al. |
| 6,960,519 B1 | 11/2005 | Dalton et al. |
| 7,026,244 B2 | 4/2006 | Ko et al. |
| 7,183,226 B2 | 2/2007 | Lee et al. |
| 7,498,242 B2 | 3/2009 | Kumar et al. |
| 7,618,889 B2 | 11/2009 | Naik |

(Continued)

FOREIGN PATENT DOCUMENTS

JP 2004158891 A 6/2004

OTHER PUBLICATIONS

Simovski, C. R., et al., "Wire Metamaterials: Physics and Applications", Advanced Materials, First published Jul. 3, 2012, 24, pp. 4229-4248, Wiley-VCH Verlag GmbH & Co., Weinheim.

*Primary Examiner* — Kimberley Rizkallah
*Assistant Examiner* — Dilinh Nguyen
(74) *Attorney, Agent, or Firm* — Scully, Scott, Murphy & Presser, P.C.; Daniel P. Morris, Esq.

(57) ABSTRACT

At least one opening having a biconvex shape is formed into a dielectric material layer. A void-free metallization region (interconnect metallic region and/or metallic contact region) is provided to each of the openings. The void-free metallization region has the biconvex shape and exhibits a low wire resistance.

10 Claims, 6 Drawing Sheets

(56) References Cited

U.S. PATENT DOCUMENTS

| | | |
|---|---|---|
| 7,947,592 B2 | 5/2011 | Dalal et al. |
| 8,441,040 B2 | 5/2013 | Minemura et al. |
| 8,569,888 B2 | 10/2013 | Chen et al. |
| 9,183,977 B2 | 11/2015 | Menath et al. |
| 9,214,424 B2 | 12/2015 | Stecher et al. |
| 2005/0173799 A1* | 8/2005 | Jou ................... H01L 21/76847 257/751 |
| 2007/0210448 A1* | 9/2007 | Wong ................... H01L 21/288 257/734 |
| 2013/0127058 A1* | 5/2013 | Lavoie .............. H01L 23/53261 257/763 |
| 2014/0264867 A1* | 9/2014 | Kuo ................. H01L 23/53238 257/751 |
| 2015/0147880 A1* | 5/2015 | Lee ................... H01L 21/76883 438/660 |
| 2015/0255339 A1* | 9/2015 | Zhang .............. H01L 21/76882 438/653 |
| 2016/0190140 A1* | 6/2016 | Basker ............. H01L 27/10829 257/532 |

\* cited by examiner

BICONVEX LOW RESISTANCE METAL WIRE

BACKGROUND

The present application relates to a semiconductor structure and a method of forming the same. More particularly, the present application relates to a semiconductor structure containing at least one void-free metallization region (interconnect metallic region and/or metallic contact region) having a biconvex shape and exhibiting a low wire resistance, and a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene interconnect structures. The interconnect structures typically include copper, Cu, since Cu based interconnects provide higher speed signal transmission between large numbers of transistors on a complex semiconductor chip as compared with aluminum, Al, based interconnects.

As the interconnect metal feature sizes shrink, it is necessary to scale diffusion barrier thickness in order to minimize the volume of the interconnect metallic region and to enable low line and via resistance. The diffusion barrier cannot, however, be scaled to zero thickness, thus dimensional changes such as, for example, asymmetric line/space methods (i.e., wide metal lines and narrow spaces) are being pursued to reduce the back-of-the-line (BEOL) interconnect resistance. Since the resistance, R, increases more rapidly than capacitance, C, as dimensions are reduced, these approaches are attractive in order to lower RC for advanced technologies nodes. However, asymmetric line/space methods suffer from dielectric flopover risks as well as increased leakage and electrical shorts.

Similar to BEOL, middle-of-the-line (MOL) resistance reduction is essential to meet overall circuit performance.

There is thus a need for providing metallization structures which exhibit an enlarged metal conductor volume created without dielectric flopover. Such metallization structures would enable low resistance for the next generation of devices.

SUMMARY

At least one opening having a biconvex shape is formed into a dielectric material layer. The term "biconvex shape" is used throughout the present application to denote a barrel shape having two sidewall surfaces that curve outward from a bottommost surface of the shape and the topmost surface of the shape reaching a maximum width in a middle portion of the shape. A void-free metallization region (interconnect metallic region and/or metallic contact region) is provided to each of the openings. The void-free metallization region has the biconvex shape and exhibits a low wire resistance.

In one aspect of the present application, a semiconductor structure is provided that contains at least one void-free metallization region (interconnect metallic region and/or metallic contact region) having a biconvex shape and exhibiting a low wire resistance. In one embodiment of the present application, the semiconductor structure includes a dielectric material layer having at least one opening located in the dielectric material layer, the at least one opening has a biconvex shape. A diffusion barrier liner is located in the at least one opening and contacts at least exposed sidewall surfaces of the dielectric material layer. A reflow enhancement liner is located on the diffusion barrier liner, and a metallic region is located on the reflow enhancement liner. The metallic region has the biconvex shape.

In another aspect of the present application, a method of forming a semiconductor structure that contains at least one void-free metallization region (interconnect metallic region and/or metallic contact region) having a biconvex shape and exhibiting a low wire resistance is provided. In one embodiment of the present application, the method includes forming a dielectric material layer having at least one opening located in the dielectric material layer, the at least one opening having a biconvex shape. Next, a diffusion barrier material is formed in the at least one opening and on a topmost surface of the dielectric material layer. A reflow enhancement layer is formed on the diffusion barrier liner, and thereafter a layer of a metal or metal alloy is formed on the reflow enhancement layer. Next, a reflow anneal is performed to completely fill a remaining volume of the at least one opening with the metal or metal alloy of the layer of metal or metal alloy, and, thereafter, the layer of metal or metal alloy, the reflow enhancement layer, and the diffusion barrier material that are located outside the at least one opening are removed. A portion of the layer of metal or metal alloy, a portion of the reflow enhancement layer, and a portion of the diffusion barrier material remain within the at least one opening after the removal process. The remaining portion of the layer of metal or metal alloy inside the at least one opening has the biconvex shape.

DETAILED DESCRIPTION

Figure 1:
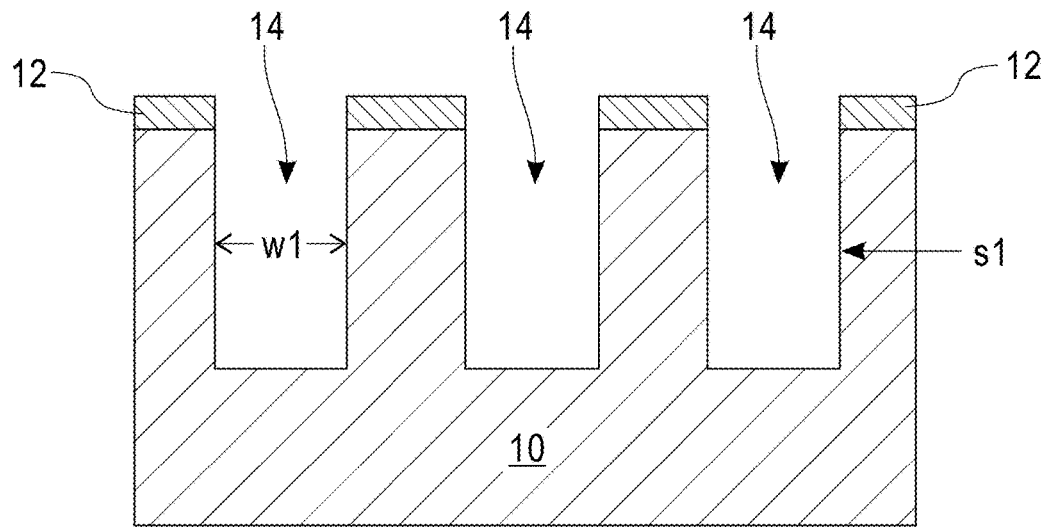
FIG. 1 is a cross sectional view of an exemplary semiconductor structure including a plurality of first openings formed in a stack of a hard mask and an interconnect dielectric material layer, the first openings having vertical sidewalls.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a plurality of first openings 14 formed in a stack of a hard mask 12 and an interconnect dielectric material layer 10, the first openings 14 having vertical sidewalls, s1, that are perpendicular to the topmost and bottommost surface of the interconnect dielectric material layer 10. Thus, the first openings 14 have a constant width, w1, from bottom to top, at this point of the present application. Although a plurality of first openings 14 is described and illustrated, the present application works when a single first opening 14 is present.

The interconnect dielectric material layer 10 may be located upon a substrate (not shown in the drawings of the present application). The substrate, which is not shown, may be composed of a semiconducting material, an insulating material, a conductive material or any combination thereof. When the substrate is composed of a semiconducting material, any material having semiconductor properties such as, for example, Si, SiGe, SiGeC, SiC, Ge alloys, III/V compound semiconductors or II/VI compound semiconductors, may be used. In addition to these listed types of semiconducting materials, the substrate that is located beneath the interconnect dielectric material layer 10 can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or any combination thereof including multilayers. When the substrate is a conductive material, the substrate may include, for example, polySi, an elemental metal, alloys of elemental metals, a metal silicide, a metal nitride or any combination thereof including multilayers. When the substrate is composed of a semiconducting material, one or more semiconductor devices such as, for example, complementary metal oxide semiconductor (CMOS) devices can be fabricated thereon. When the substrate is composed of a combination of an insulating material and a conductive material, the substrate may represent an underlying interconnect level of a multilayered interconnect structure.

The interconnect dielectric material layer 10 that is employed in the present application may be composed of any interlevel or intralevel dielectric including inorganic dielectrics or organic dielectrics. In one embodiment, the interconnect dielectric material layer 10 may be non-porous. In another embodiment, the interconnect dielectric material layer 10 may be porous. Some examples of suitable dielectrics that can be used as the interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material layer 10 may vary depending upon the type of dielectric material(s) used. In one example, the interconnect dielectric material layer 10 may have a thickness from 50 nm to 1000 nm. Other thicknesses that are lesser than, or greater than, the aforementioned thickness range may also be employed in the present application for the thickness of the interconnect dielectric material layer 10.

A hard mask material (not shown) which provides the hard mask 12 is then formed on the topmost surface of the interconnect dielectric material layer 10. The hard mask material may be composed of a dielectric oxide, a dielectric nitride and/or a dielectric oxynitride. In one example, the hard mask material that provides the hard mask 12 may be composed of silicon dioxide or silicon nitride. In another example, the hard mask material that provides the hard mask 12 may be a hard mask material stack of, in any order, silicon dioxide and silicon nitride.

In some embodiments of the present application, the hard mask material that provides the hard mask 12 may be formed utilizing a deposition process such as, for example, chemical vapor deposition (CVD) or plasma enhanced chemical vapor deposition (PECVD). In other embodiments of the present application, the hard mask material that can be used in providing the hard mask 12 can be formed by a thermal process such as, for example, thermal oxidation and/or thermal nitridation. In yet other embodiments of the present application, the hard mask material that can be used in providing the hard mask 12 can be formed by a combination of a deposition process and a thermal process. The thickness of the hard mask material that provides the hard mask 12 can be from 10 to 50 nm, although other thicknesses that are lesser than, or greater than the values recited in the present application can be employed as the thickness of the hard mask material that provides the hard mask 12.

The at least one first opening 14 that is formed into the stack of the hard mask material and the interconnect dielectric material layer 10 can be formed utilizing a patterning process. After partial or complete patterning, the remaining hard mask material provides the hard mask 12 of the present application.

In one embodiment, the patterning process may include lithography and etching. The lithographic process includes forming a photoresist (not shown) atop the stack of the hard mask material and the interconnect dielectric material layer 10, exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one first opening 14. In some embodiments, the etching process includes a first pattern transfer step in which the pattern provided to the photoresist is transferred to the hard mask material providing hard mask 12, the patterned photoresist is then removed by an ashing step, and thereafter, a second pattern transfer step is used to transfer the pattern from the hard mask 12 into the underlying interconnect dielectric material layer 10.

The depth of the at least one first opening 14 that is formed into the interconnect dielectric material layer 10 (measured from the topmost surface of the interconnect dielectric material layer 10 to the bottom wall of the at least one opening) may vary. In some embodiments, the at least one first opening 14 may extend entirely through the interconnect dielectric material layer 10. In yet other embodiments, the at least one first opening 14 stops within the interconnect dielectric material layer 10 itself. In yet further embodiments, different depth first openings 14 can be formed into the interconnect dielectric material layer 10.

Figure 2:
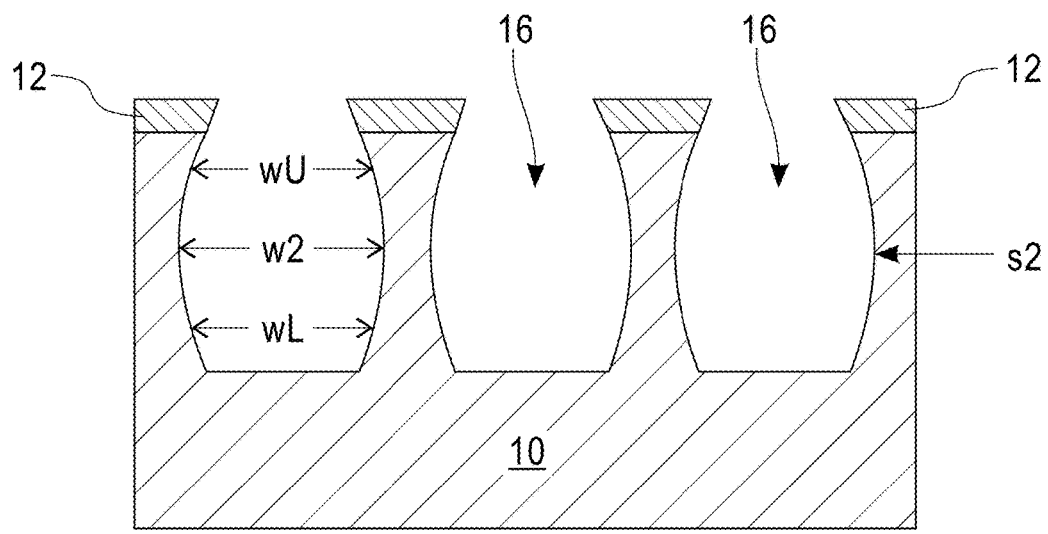
FIG. 2 is a cross sectional view of the exemplary semiconductor structure of FIG. 1 after performing an etch to convert each first opening into a second opening having a biconvex shape.

Referring now to FIG. 2, there is illustrated the exemplary semiconductor structure of FIG. 1 after performing an etch to convert each first opening 14 into a second opening 16 having a biconvex shape. Each second opening 16 that is provided has two sidewall surfaces, one of which is labeled as s2 in the drawing, that curve outwards from a topmost surface and a bottommost surface as shown in FIG. 2. Each second opening 16 thus has a width at a middle portion, w2, that is greater than a width at a lower portion, wL, and an upper portion, wU.

Each second opening 16 is provided by performing an etch utilizing hard mask 12 as an etch mask; some thinning of each hard mask 12 may occur during this etch. In one embodiment of the present application, each second opening 16 is provided by first ashing of the exposed sidewall surfaces of the interconnect dielectric material layer 10 within each of the first openings 14 using a mixture of oxygen, carbon dioxide, and carbon monoxide, to form the curved sidewall surfaces, s2. Next, a wet etch in hydrofluoric acid is employed to clean the curved sidewall surfaces, s2. In some embodiments, the ashing process may deplete carbon from the exposed sidewall surfaces of the interconnect dielectric material layer 10. In some embodiments, the ashing process may form a dielectric oxide region along the exposed sidewall surfaces of the interconnect dielectric material layer 10.

Figure 3:
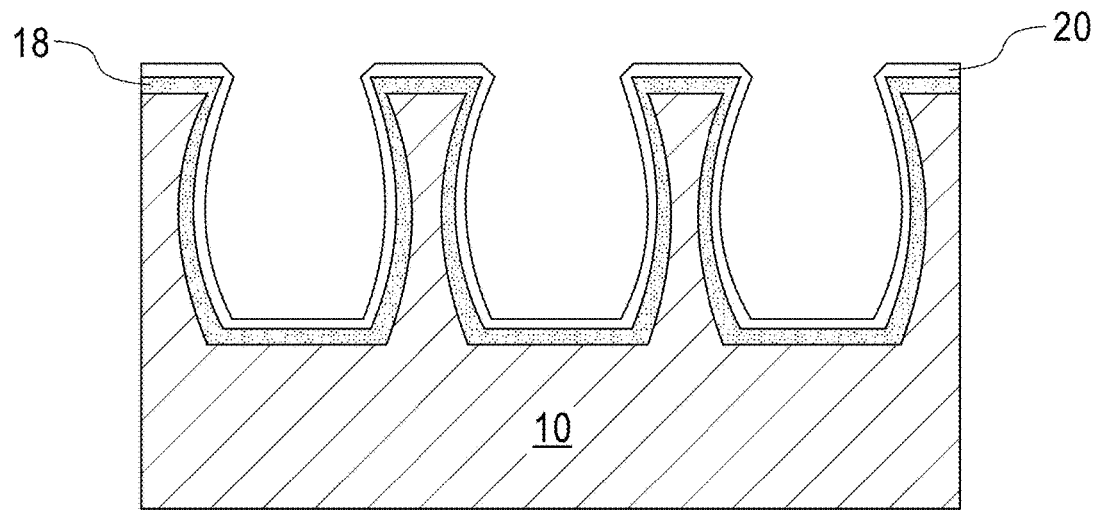
FIG. 3 is a cross sectional view of the exemplary semiconductor structure of FIG. 2 after removing the hard mask and forming a diffusion barrier material and a reflow enhancement layer.

Referring now to FIG. 3, there is illustrated the exemplary semiconductor structure of FIG. 2 after removing the hard mask 12 and forming a diffusion barrier material 18 and a reflow enhancement layer 20. As is shown, and after removing the hard mask 12, the diffusion barrier material 18 is formed as a continuous layer on the exposed topmost surface of the interconnect dielectric material layer 10 and along the curved sidewall surfaces, s2, and bottommost surface of each second opening 16. The reflow enhancement layer 20 is a continuous layer that is formed on the diffusion barrier material 18.

The hard mask 12 may be removed utilizing an etch or a planarization process such as, for example, chemical mechanical polishing and/or grinding. The removal of the hard mask 12 exposes a topmost surface of the interconnect dielectric material layer 10.

After hard mask 12 removal, the diffusion barrier material 18 is formed. The diffusion barrier material 18 includes Ta, TaN, Ti, TiN, Ru, RuN, RuTa, RuTaN, W, WN or any other material that can serve as a barrier to prevent a conductive material such as copper from diffusing there through. In some embodiments, the diffusion barrier material may include a material stack of such diffusion barrier materials. In one example, the diffusion barrier may be composed of a stack of Ta/TaN.

The thickness of the diffusion barrier material 18 may vary depending on the deposition process used as well as the material employed. In some embodiments, the diffusion barrier material 18 may have a thickness from 2 nm to 50 nm; although other thicknesses for the diffusion barrier material 18 are contemplated and can be employed in the present application. The diffusion barrier material 18 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

The reflow enhancement layer 20 is then formed on the diffusion barrier material 18. The reflow enhancement layer 20 includes any metal or metal alloy that facilities in the movement (i.e., flow) of another deposited metal or metal alloy that differs in composition from the reflow enhancement layer during a subsequently performed reflow anneal process. Examples of metals or metal alloys that may be employed as the reflow enhancement layer 20 include ruthenium, iridium, a tantalum-iridium alloy, a niobium-ruthenium alloy and a niobium-iridium alloy. In one embodiment and when a layer of copper is to be subsequently formed and reflowed, the reflow enhancement layer 20 is composed of ruthenium.

The thickness of reflow enhancement layer 20 may vary depending on the material of the reflow enhancement layer 20 as well as the technique used in forming the same. Typically, the reflow enhancement layer 20 has a thickness from 2 nm to 80 nm. The reflow enhancement layer 20 can be formed by a conventional deposition process including, for example, CVD, PECVD, ALD, or PVD.

It is noted that the total thickness of the diffusion barrier material 18 and the reflow enhancement layer 20 is insufficient to completely fill the total volume of each second opening 16. Thus, a portion (i.e., a volume) of each second opening 16 is available for further processing.

Figure 4:
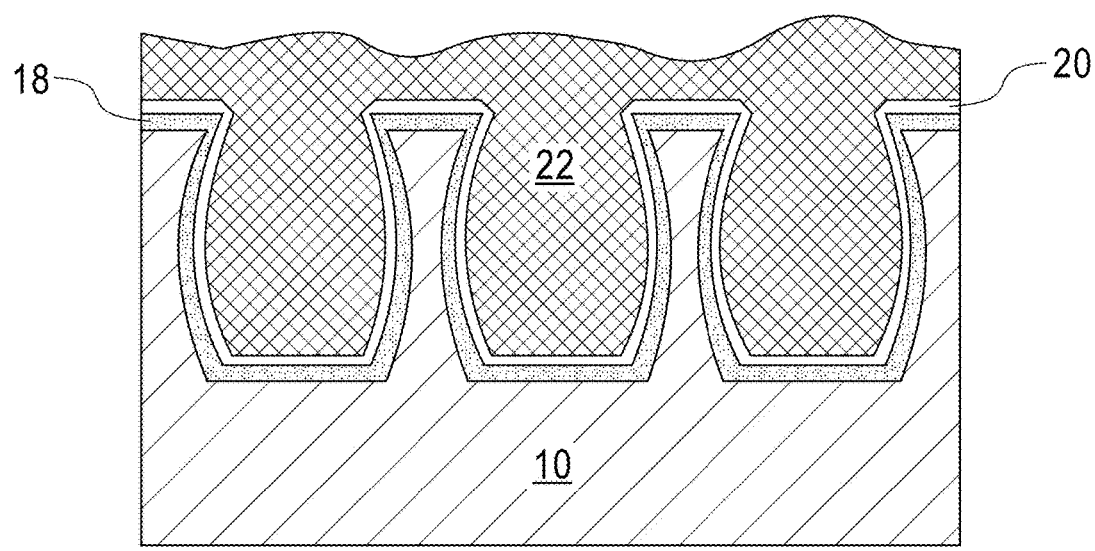
FIG. 4 is a cross sectional view of the exemplary semiconductor structure of FIG. 3 after depositing a layer of an interconnect metal or metal alloy and performing a reflow anneal.

Referring now to FIG. 4, there is illustrated the exemplary semiconductor structure of FIG. 3 after depositing a layer of an interconnect metal or metal alloy and performing a reflow anneal. In FIG. 4, element 22 denotes the deposited and reflowed interconnect metal or metal alloy. As is shown, the deposited and reflowed interconnect metal or metal alloy 22 completely fills in the remaining portion (i.e., volume) of each second opening 16; an overburden portion of the deposited and reflowed interconnect metal or metal alloy 22 forms outside each second opening 16 and above the topmost surface of the interconnect dielectric material layer 10.

The deposited and reflowed interconnect metal or metal alloy 22 is formed by first depositing an interconnect metal or metal alloy directly on the reflow enhancement layer 20 and then performing a reflow anneal. The interconnect metal or metal alloy that may be employed in the present application includes copper (Cu), aluminum (Al), or a Cu-Al alloy. The interconnect metal or metal alloy can be formed by a deposition process including PVD, chemical vapor deposition (CVD), plasma enhanced chemical vapor deposition (PECVD), sputtering, chemical solution deposition or plating.

Next, a reflow anneal is performed. In one embodiment of the present application, the reflow anneal is a thermal anneal. In one example, the reflow anneal may include a furnace anneal or a hot plate anneal. The reflow anneal may be performed at a temperature from 100° C. to 500° C. Other temperatures can also be employed so long as the selected reflow anneal temperature causes the reflow of the interconnect metal or metal alloy. The duration of the reflow anneal may vary depending upon the temperature used during the thermal anneal. In one embodiment and for a temperature from 100° C. to 500° C., the reflow anneal may be performed for a duration of 20 minutes to 3 hours.

The reflow anneal is typically performed in a nitrogen-containing ambient or a hydrogen-containing ambient. The nitrogen-containing ambients that can be employed in the present application include, but are not limited to, $N_2$, or $NH_3$, and mixtures thereof. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient. Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical.

Figure 5:
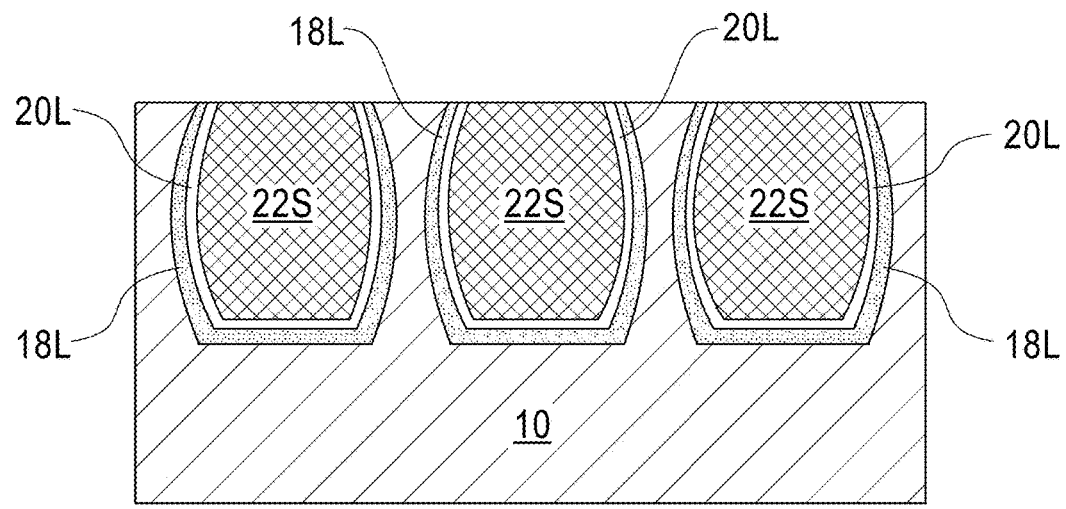
FIG. 5 is a cross sectional view of the exemplary semiconductor structure of FIG. 4 after performing a planarization process.

Referring now to FIG. 5, there is illustrated the exemplary semiconductor structure of FIG. 4 after performing a planarization process. The planarization process removes portions of the deposited and reflowed interconnect metal or metal alloy 22, portions of the reflow enhancement layer 20, and portions of the diffusion barrier material 18 that are present outside each second opening 16. Planarization may be performed utilizing chemical mechanical polishing and/ or grinding.

After planarization, a portion of the deposited and reflowed metal interconnect metal or metal alloy 22, a portion of the reflow enhancement layer 20, and a portion of the diffusion barrier material 18 remain within each second opening 16. Each remaining portion of the deposited and reflowed metal interconnect metal or metal alloy 22 can be referred to as interconnect metallic region 22S. Each remaining portion of the reflow enhancement layer 20 can be referred to herein as a reflow enhancement liner 20L, and each remaining portion of the diffusion barrier material 18 may be referred to herein as a diffusion barrier liner 18L. As is shown, topmost surfaces of each of the interconnect metallic region 22S, the reflow enhancement liner 20L, and the diffusion barrier liner 18L that are present in each second opening 16 are coplanar with each other as well as being coplanar with a topmost surface of the interconnect dielectric material layer 10.

Since each second opening 16 has a biconvex shape, each interconnect metallic region 22S also has a biconvex shape. This provides an enlarged volume for each interconnect metallic region 22S as compared to an equivalent structure in which the second openings 16 are not formed. In some embodiments, each interconnect metallic region 22S having the biconvex shape may have a 20 percent to 40 percent increase in total volume as compared to an interconnect metallic region having perpendicular sidewall surfaces (processed as described above by omitting the formation of the second openings 16). Due to the increase in total volume of the interconnect metallic region 22S, a large reduction in wire resistance can be obtained.

Figure 6:
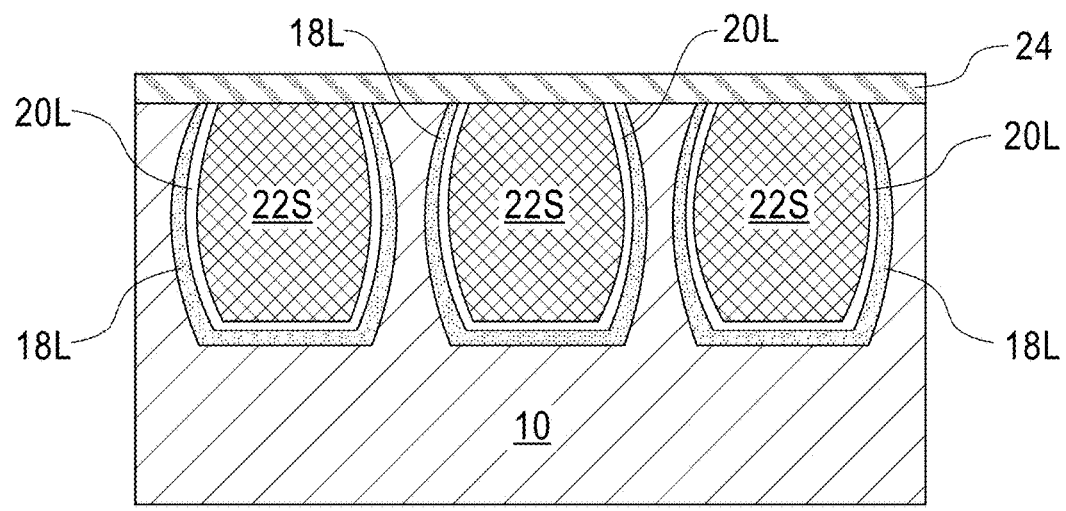
FIG. 6 is a cross sectional view of the exemplary semiconductor structure of FIG. 5 after forming a cap on exposed surfaces of the planarized structure.

Referring now to FIG. 6, there is illustrated the exemplary semiconductor structure of FIG. 5 after forming a cap 24 on exposed surfaces of the planarized structure. Cap 24 is formed on topmost surfaces of each interconnect metallic region 22S, each reflow enhancement liner 20L, each diffusion barrier liner 18L and atop the topmost surface of the interconnect dielectric material layer 10.

In some embodiments of the present application, cap 24 is composed of a dielectric capping material such as, for example, SiC, $Si_3N_4$, $SiO_2$, a carbon doped oxide, a nitrogen and hydrogen doped silicon carbide SiC(N,H) or multilayers thereof. In other embodiments, cap 24 may be composed of a metal cap such as, for example, CoWP. The cap 24 can be formed utilizing a conventional deposition process such as, for example, chemical vapor deposition, plasma enhanced chemical vapor deposition, chemical solution deposition, evaporation, or atomic layer deposition. The thickness of the cap 24 may vary depending on the technique used to form the same as well as the material make-up of the layer. Typically, the cap 24 has a thickness from 15 nm to 100 nm. Other thicknesses that are lesser than 15 nm, or greater 100 nm may also be employed as the thickness of the cap 24.

Figure 7:
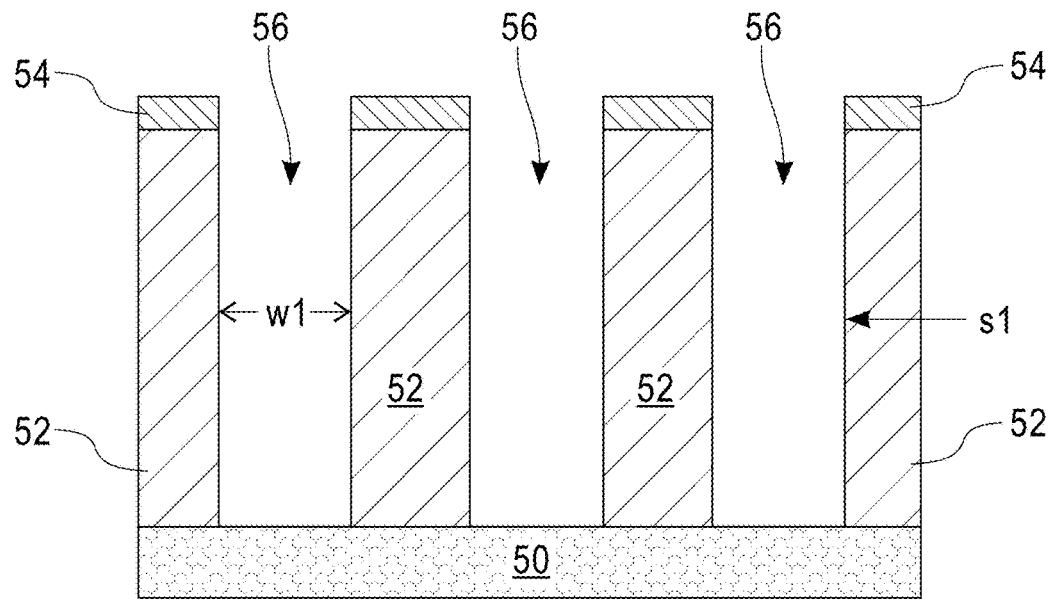
FIG. 7 is cross sectional view of another exemplary semiconductor structure including a plurality of first openings formed in a stack of a hard mask and a middle-of-the-line (MOL) dielectric material layer, the first openings having vertical sidewalls.

Referring now to FIG. 7, there is illustrated another exemplary semiconductor structure including a plurality of first openings 56 formed in a stack of a hard mask 54 and a middle-of-the-line (MOL) dielectric material layer 52, the first openings 56 have vertical sidewalls, s1, and a constant width, w1. In this embodiment, the MOL dielectric material layer 52 is formed on a surface of a substrate 50. The substrate 50 may include a semiconductor substrate containing one or more semiconductor devices, i.e., transistors, formed thereon. The one or more semiconductor devices are not shown but would be located on a surface of substrate 50 and would be embedded within some portions of the MOL dielectric material layer 52. Although a plurality of first openings 56 is described and illustrated, the present application works when a single first opening 56 is present.

In one embodiment of the present application, the substrate 50 is first provided and then the one or more semiconductor devices are formed thereon. The MOL dielectric material layer 52 is then formed. In other embodiments, sacrificial structures are formed on the surface of the substrate 50 and then the MOL dielectric material layer 52 is formed. After forming the MOL dielectric material layer 52, the sacrificial structure may be replaced with a functional semiconductor device.

In some embodiments, the MOL dielectric material layer 52 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material layer 52. The use of a self-planarizing dielectric material as MOL dielectric material layer 52 may avoid the need to perform a subsequent planarizing step.

In one embodiment, the MOL dielectric material layer 52 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as MOL dielectric material layer 52, a planarization process or an etch back process follows the deposition of the dielectric material. The thickness of the MOL dielectric material layer 52 that can be employed in the present application may vary depending on the type of dielectric material employed as well as the method that was employed in forming the same. In one embodiment, the MOL dielectric material layer 52 has a thickness from 80 nm to 500 nm. Other thicknesses that are greater or lesser than the range provided above can also be used for the MOL dielectric material layer 52.

Next, a hard mask material is formed on the MOL dielectric material layer 52. The hard mask material of this embodiment of the present application may include one of the hard mask materials mentioned above for providing hard mask 12. The hard mask material of this embodiment of the present application may be formed utilizing one of the techniques mentioned above in providing the hard mask material for hard mask 12. The hard mask material of this embodiment of the present application may have a thickness as defined above for the hard mask material used in providing hard mask 12.

The first openings 56 of this embodiment of the present application can be formed utilizing the patterning process mentioned above in forming the first openings 14 in the interconnect dielectric material layer 10. In some embodiments of the present application, each first opening 56 can extend entirely though the MOL dielectric material layer 52 and expose a portion of the substrate 50. In some embodiments, the exposed portion of the substrate 50 represents a source/drain region of a transistor. The first openings 56 of this embodiment are the same as the first openings 14 formed in the first embodiment of the present application. Element 54 denotes portions of the hard mask materials (i.e., a hard mask 54) that remain after complete or partial patterning.

Figure 8:
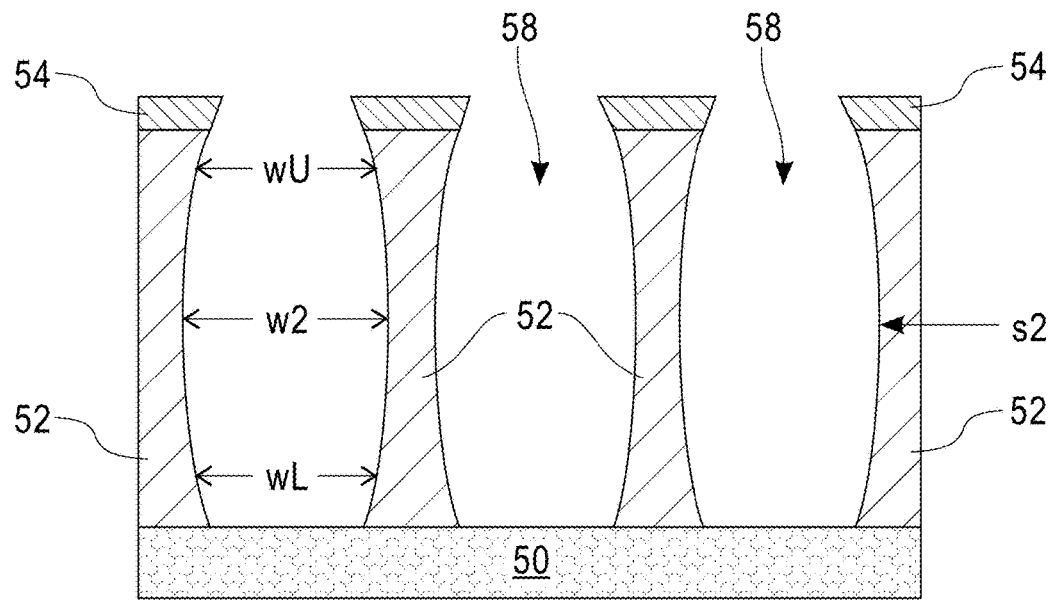
FIG. 8 is a cross sectional view of the exemplary semiconductor structure of FIG. 7 after performing an etch to convert each first opening into a second opening having a biconvex feature.

Referring now to FIG. 8, there is illustrated the exemplary semiconductor structure of FIG. 7 after performing an etch to convert each first opening 56 into a second opening 58 having a biconvex shape.

Each second opening 58 that is provided has two sidewall surfaces, one of which is labeled as s2 in the drawing, that curve outwards from a topmost surface and a bottommost surface as shown in FIG. 8. Each second opening 58 thus a width at a middle portion, w2, that is greater than a width at a lower portion, wL, and an upper portion, wU.

Each second opening 58 is provided by performing an etch utilizing hard mask 54 as an etch mask; some thinning of hard mask 54 may occur during this etch. In one embodiment of the present application, each second opening 58 is provided by first ashing of the exposed sidewall surfaces of the MOL dielectric material layer 52 within each of the first openings 56 using a mixture of oxygen, carbon dioxide, and carbon monoxide, to form the curved sidewall surfaces, s2. Next, a wet etch in hydrofluoric acid is employed to clean the curved sidewall surfaces s2. In some embodiments, the ashing process may deplete carbon from the exposed sidewall surfaces of MOL dielectric material layer 52. In some embodiments, the ashing process may form a dielectric oxide region along the exposed sidewall surfaces of the MOL dielectric material layer 52.

Figure 9:
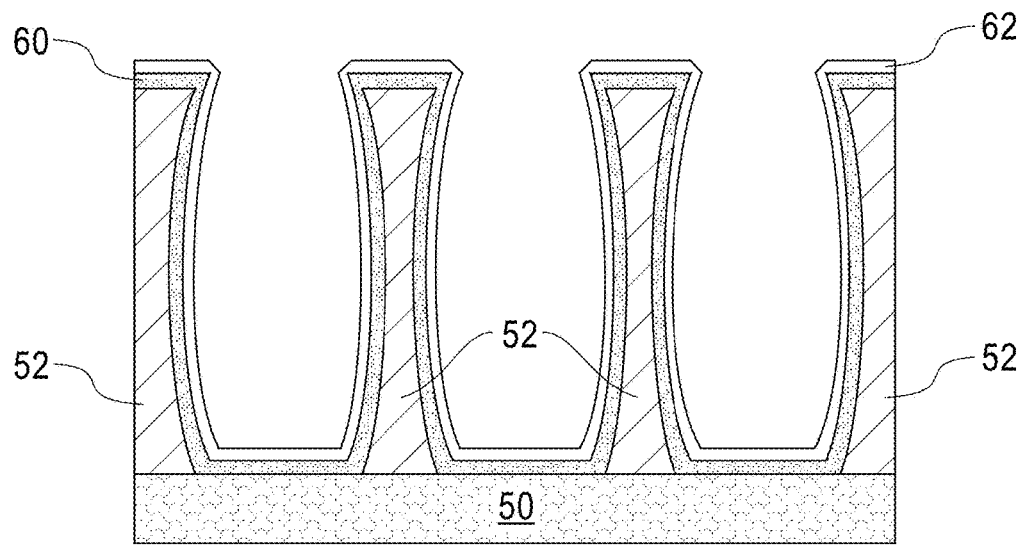
FIG. 9 is a cross sectional view of the exemplary semiconductor structure of FIG. 8 after removing the hard mask and forming a diffusion barrier material and a reflow enhancement layer.

Referring now to FIG. 9, there is illustrated the exemplary semiconductor structure of FIG. 8 after removing the hard mask 54 and forming a diffusion barrier material 60 and a reflow enhancement layer 62.

The diffusion barrier material 60 of this embodiment of the present application is the same as the diffusion barrier material 18 utilized in the first embodiment of the present application. The diffusion barrier material 60 may include one of the diffusion barrier materials mentioned above for diffusion barrier material 18. Also, diffusion barrier material 60 can be formed and have a thickness as described above for diffusion barrier material 18.

The enhancement layer 62 is then formed on the diffusion barrier material 60. The reflow enhancement layer 62 includes any metal or metal alloy that facilities in the movement (i.e., flow) of another deposited metal or metal alloy that differs in composition from the reflow enhancement layer during a subsequently performed reflow anneal process. Examples of metals or metal alloys that may be employed as the reflow enhancement layer 62 include ruthenium, iridium, a tantalum-iridium alloy, a niobium-ruthenium alloy and a niobium-iridium alloy. In one embodiment and when a layer of cobalt is to be subsequently formed and reflowed, the reflow enhancement layer 62 is composed of iridium.

The thickness of reflow enhancement layer 62 may vary depending on the material of the reflow enhancement layer 62 as well as the technique used in forming the same. Typically, the reflow enhancement layer 62 has a thickness from 2 nm to 80 nm. The reflow enhancement layer 62 can be formed by a conventional deposition process including, for example, CVD, PECVD, ALD, or PVD.

It is noted that the total thickness of the diffusion barrier material 60 and the reflow enhancement layer 62 is insufficient to completely fill the total volume of each second opening 58. Thus, a portion (a volume) of each second opening 58 is available for further processing.

Figure 10:
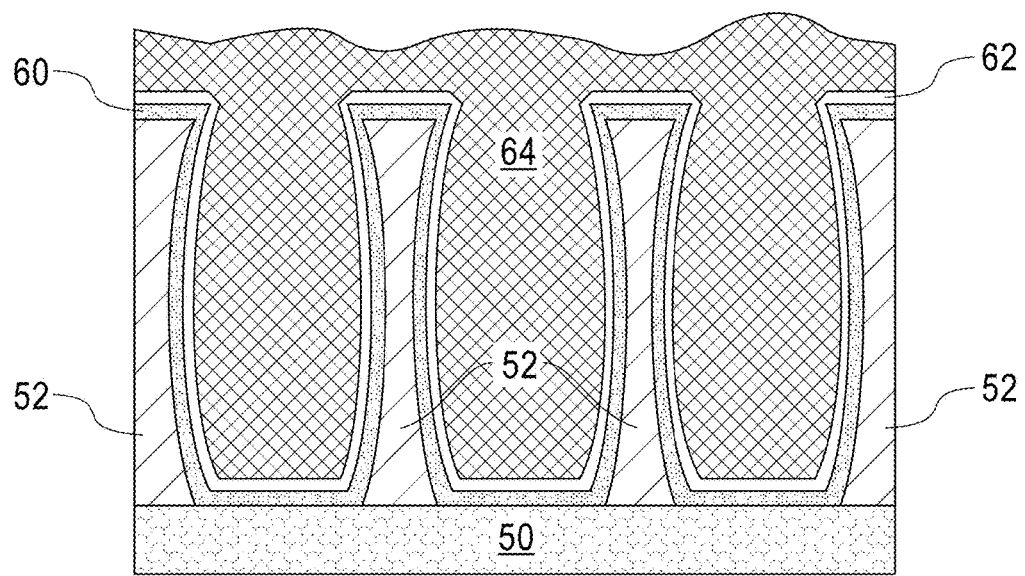
FIG. 10 is a cross sectional view of the exemplary semiconductor structure of FIG. 9 after depositing a layer of a contact metal or metal alloy and performing a reflow anneal.

Referring now to FIG. 10, there is illustrated the exemplary semiconductor structure of FIG. 9 after depositing a layer of a contact metal or metal alloy and performing a reflow anneal. In FIG. 10, element 64 denotes the deposited and reflowed layer of contact metal or metal alloy. As is shown, the deposited and reflowed layer of contact metal or metal alloy 64 completely fills in the remaining portion (i.e., volume) of each second opening 58; an overburden portion of the deposited and reflowed layer of contact metal or metal alloy 64 forms outside each second opening 58 and above the topmost surface of the MOL dielectric material layer 52.

The deposited and reflowed layer of contact metal or metal alloy 64 is formed by first depositing a contact metal or metal alloy directly on the reflow enhancement layer 62 and then performing a reflow anneal. The contact metal or metal alloy that may be employed in the present application includes cobalt (Co), platinum, (Pt) and/or nickel (Ni). The contact metal or metal alloy can be formed by a deposition process including PVD, chemical vapor deposition (CVD), plasma enhanced chemical vapor deposition (PECVD), sputtering, chemical solution deposition or plating.

Next, a reflow anneal is performed. The reflow anneal of this embodiment of the present application is the same as described above for the previous embodiment of the present application.

Figure 11:
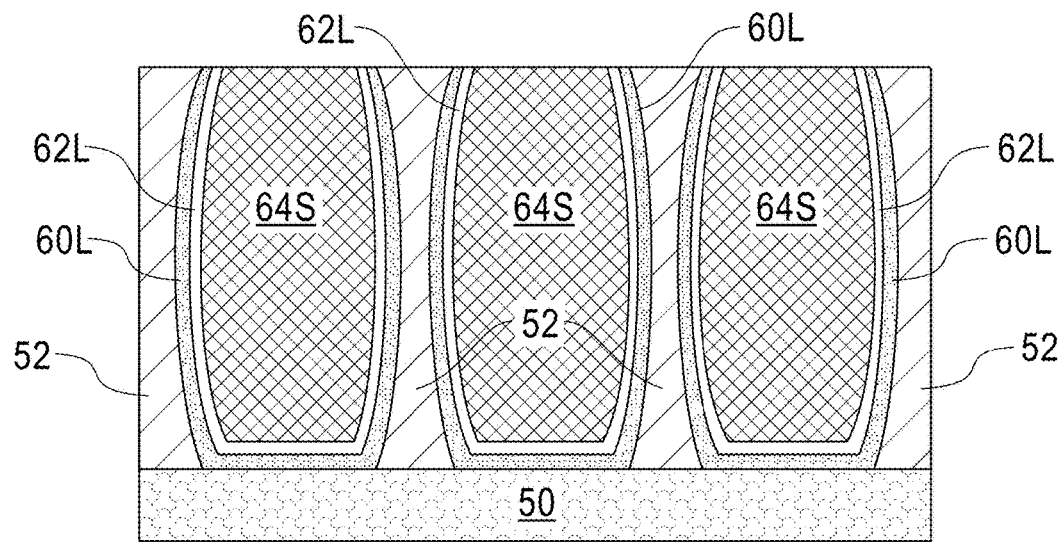
FIG. 11 is a cross sectional view of the exemplary semiconductor structure of FIG. 10 after performing a planarization process.

Referring now to FIG. 11, there is illustrated the exemplary semiconductor structure of FIG. 10 after performing a planarization process. The planarization process removes portions of the deposited and reflowed layer of contact metal or metal alloy 64, portions of the reflow enhancement layer 62, and portions of the diffusion barrier material 60 that are present outside each second opening 58. Planarization may be performed utilizing chemical mechanical polishing and/or grinding.

After planarization, a portion of the deposited and reflowed layer of contact metal or metal alloy 64, a portion of the reflow enhancement layer 62, and a portion of the diffusion barrier material 60 remain within each second opening 58. Each remaining portion of the deposited and reflowed layer of contact metal or metal alloy 64 can be referred to as contact metallic region 64S. Each remaining portion of the reflow enhancement layer 62 can be referred to herein as a reflow enhancement liner 62L, and each remaining portion of the diffusion barrier material 60 may be referred to herein as a diffusion barrier liner 60L. As is shown, topmost surfaces of the contact metallic region 64S, the reflow enhancement liner 62L, and the diffusion barrier liner 60L that are present in each second opening 58 are coplanar with each other as well as being coplanar with a topmost surface of the MOL dielectric material layer 52.

Since each second opening 58 has a biconvex shape, each contact metallic region 64S also has a biconvex shape. This provides an enlarged volume for each contact metallic region 64S as compared to an equivalent structure in which the second openings 58 are not formed. In some embodiments, each contact metallic region 64S having the biconvex shape may have a 20 percent to 40 percent increase in total volume as compared to a metallic region having perpendicular sidewall surfaces (processed as described above by omitting the formation of the second openings 58). Due to the increase in total volume of the contact metallic region 64S, a large reduction in wire resistance can be obtained.

Figure 12:
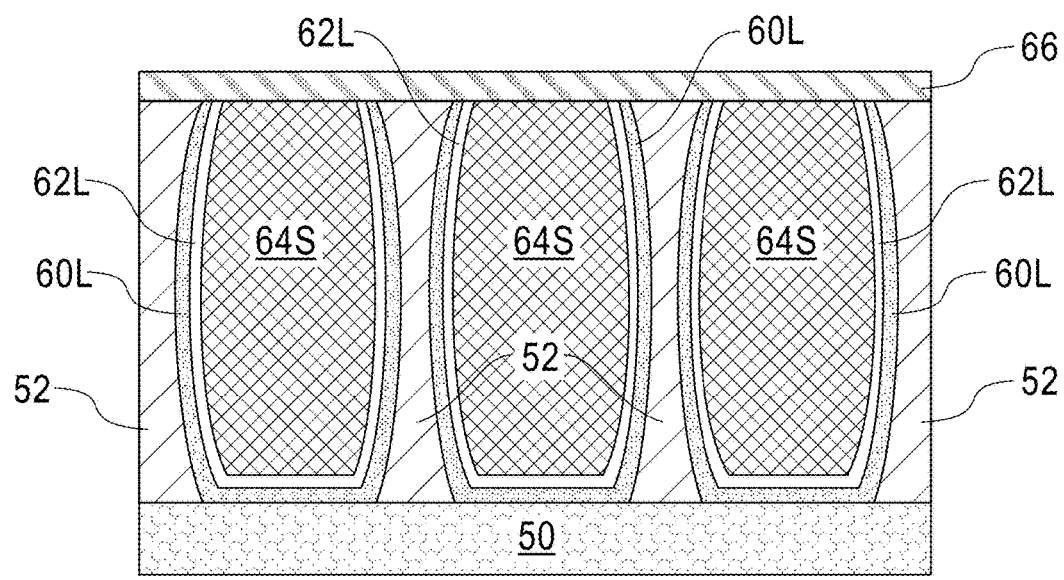
FIG. 12 is a cross sectional view of the exemplary semiconductor structure of FIG. 11 after forming a cap on exposed surfaces of the planarized structure.

Referring now to FIG. 12, there is illustrated the exemplary semiconductor structure of FIG. 11 after forming a cap 66 on exposed surfaces of the planarized structure. Cap 66 of this embodiment of the present application may include one of cap materials mentioned above for cap 24 of the previous embodiment of the present application. Cap 66 may be formed and have a thickness as described above for cap 24.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a dielectric material layer having at least one opening located in said dielectric material layer, said at least one opening physically exposing a pair of curved sidewalls of said dielectric material layer and having a biconvex shape comprising a lower portion having a first width, a middle portion having a second width, and an upper portion having a third width, wherein the second width is greater than the first and third widths;
    a diffusion barrier liner located in said at least one opening and contacting at least said pair of curved sidewalls of said dielectric material layer;
    a reflow enhancement liner located on said diffusion barrier liner; and
    a metallic region located on said reflow enhancement liner, said metallic region having a pair of curved outermost sidewalls, said biconvex shape and comprising a lower metallic region portion having a first metallic region width, a middle metallic region portion having a second metallic region width, and an upper metallic region portion having a third metallic region width, wherein the second metallic region width is greater than the first and third metallic region widths.

2. The semiconductor structure of claim 1, wherein said dielectric material layer is an interconnect dielectric material, and said metallic region comprises an interconnect metal or metal alloy.

3. The semiconductor structure of claim 2, wherein said interconnect metal or metal alloy comprises copper or a copper-aluminum alloy.

4. The semiconductor structure of claim 3, wherein said reflow enhancement liner is composed of ruthenium.

5. The semiconductor structure of claim 1, wherein said dielectric material layer is a middle-of-the-line (MOL) dielectric material, and said metallic region comprises a contact metal or metal alloy.

6. The semiconductor structure of claim 5, wherein said contact metal or metal alloy comprises cobalt.

7. The semiconductor structure of claim 6, wherein said reflow enhancement liner is composed of iridium.

8. The semiconductor structure of claim 1, wherein topmost surfaces of each of said dielectric material layer, said diffusion barrier liner, said reflow enhancement liner and said metallic region are coplanar with each other.

9. The semiconductor structure of claim 1, further comprising a cap located on topmost surfaces of each of said dielectric material layer, said diffusion barrier liner, said reflow enhancement liner and said metallic region.

10. The semiconductor structure of claim 1, wherein said reflow enhancement liner is composed of a metal or metal alloy selected from the group consisting of ruthenium, iridium, a tantalum-iridium alloy, a niobium-ruthenium alloy and a niobium-iridium alloy.

* * * * *